United States Patent
Matsuda

[11] 3,984,682
[45] Oct. 5, 1976

[54] MASS SPECTROMETER WITH SUPERIMPOSED ELECTRIC AND MAGNETIC FIELDS

[75] Inventor: Hisashi Matsuda, Takarazuka, Japan

[73] Assignee: Nihon Denshi Kabushiki Kaisha, Tokyo, Japan

[22] Filed: Feb. 25, 1975

[21] Appl. No.: 552,880

[30] Foreign Application Priority Data
July 12, 1974  Japan.............................. 49-79964
July 12, 1974  Japan.............................. 49-79965

[52] U.S. Cl. ............................... 250/296; 250/294
[51] Int. Cl.² ...................................... B01D 59/44
[58] Field of Search ........... 250/296, 294, 295, 297, 250/298; 313/63

[56] References Cited
UNITED STATES PATENTS
3,061,720  10/1962  Ewald ................................ 250/294
3,816,748  6/1974  Harrison ............................ 250/296
3,886,357  5/1975  Naito .................................. 250/296

Primary Examiner—Alfred E. Smith
Assistant Examiner—T. N. Grigsby
Attorney, Agent, or Firm—Webb, Burden, Robinson & Webb

[57] ABSTRACT

A mass spectrometer employing superimposed electric and magnetic fields arranged substantially at right angles. The central orbit of the ion beam is located on an equipotential surface in the electric field at right angles to the magnetic field. The ions constituting the ion beam are separated in accordance with their mass to charge ratios by superimposed fields. The field strengths are adjusted to satisfy the two dimensional double focusing condition.

7 Claims, 5 Drawing Figures

MASS SPECTROMETER WITH SUPERIMPOSED ELECTRIC AND MAGNETIC FIELDS

This invention relates to a mass spectrometer employing superimposed fields comprising an electric field and a magnetic field arranged substantially at right angles.

Various types of mass spectrometers are being used in the field of chemical analysis and related fields. These include: (1) deflecting type mass spectrometers in which the ions constituting the ion beam are separated by a magnetic field in accordance with their mass to charge (m/e) ratios, (2) quadrupole type spectrometers in which a hyperbolic electric field formed by adding a fixed (constant) electric field and a high frequency electric field utilizes only stable ions having a specific m/e ratio, and (3) the time-of-flight spectrometers which utilize the difference in the time-of-flight (travel time) of the ions according to their mass. Of these various types of mass spectrometers, the most generally used instrument is the deflecting type mass spectrometer as it surpasses all the others with respect to performance and stability. However, the conventional deflecting type mass spectrometer cannot compete with certain other type of mass spectrometers from the standpoint of compactness and price.

Deflecting type mass spectrometers can be broadly classified into two categories, viz, single and double focusing mass spectrometers, according to the type of ion beam optical system employed. In the single focus category, directional but not velocity focusing is possible and in the double focus category, both directional and velocity focusing are possible. Moreover, the double focusing type mass spectrometer offers a resolution 10 to 100 times better than the single focusing type instrument. Heretofore, in the double focusing type mass spectrometer, the electric field and magnetic field are arranged separately. Accordingly, since directional and velocity focusing are mutually related, focusing adjustment must inevitably be carried out by adopting the so-called successive approximation method which involves alternately shifting of the magnet in two vertical directions; an intricate and exacting procedure to say the least.

An advantage of this invention is to provide means whereby the size and cost of deflecting type mass spectrometers can be reduced and whereby directional and velocity focusing adjustments can be carried out easily.

Another advantage of this invention is to provide a novel mass spectrometer utilizing superimposed fields comprising an electric field and a magnetic field arranged substantially at right angles, the central orbit of the ion beam being located in the equipotential surface in the electric field at right angles to the magnetic field.

A further advantage of this invention is to provide a novel mass spectrometer utilizing a superimposed field whereby the conditions of velocity and two dimensional stigmatic focusing are satisfied.

Yet another advantage of this invention is to provide a novel mass spectrometer utilizing a superimposed field whereby the condition of velocity focusing only is satisfied.

A still further advantage of this invention is to provide a small size mass spectrometer capable of offering high resolution.

Still another advantage of this invention is to provide a single focusing mass spectrometer utilizing a superimposed field.

Still a further advantage of this invention is to provide a small size single focusing mass spectrometer utilizing a superimposed field comprising an electric field and a weak magnetic field located at right angles to said electric field.

An even further advantage of this invention is to provide a mass spectrometer utilizing a superimposed field having a weak magnetic field, said mass spectrometer being capable of detecting ions having a large mass to charge ratio.

BRIEF DESCRIPTION

Briefly, according to this invention, a mass spectrometer is provided with superimposed electric and magnetic fields substantially at right angles.

The ion beam to be analyzed passes through the superimposed fields in a central orbit that coincides with an equipotential surface of the electric field. In one embodiment, the electric field is arranged to oppose the action of the magnetic field turning the ion beam through its orbit. The radius a of the central ion orbit is determined by the equation $$1/a = 1/a_e + 1/a_m$$

where $a_e$ is the radius of the ion orbit along an equipotential plane in an independently existing magnetic field of the same strength and where $a_m$ is the radius of the ion orbit in an independently existing magnetic field of the same strength. Now, when the electric and magnetic fields satisfy the relationship $$a/a_e = -1 \text{ and } a/a_m = 2$$

the double focusing condition in the radial direction is satisfied.

If the strength and configuration of the electric and magnetic fields satisfy the relationship $C + 2n = -1$, where $C$ is a characteristic of the electric field and n is a characteristic of the magnetic field (both of which are explained hereafter) the double focusing condition is satisfied in both the radial and axial directions.

Further objects and advantages will become more apparent by reading through the following detailed description in conjunction with the accompanying drawings of which:

THE ELECTRIC AND MAGNETIC FIELDS

Figure 1:
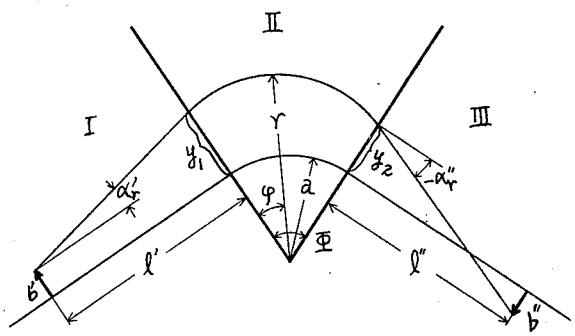
FIG. 1 is an explanatory drawing of the ion beam optical system according to this invention.

In mass spectrometers according to this invention, ions of a given mass to charge ratio (m/e) travel through the superimposed electric and magnetic fields (hereafter electromagnetic field) in a substantially circular orbit. Ions entering the electromagnetic field at the desired or theoretical angle and velocity travel the "central orbit."

It is assumed in this description of applicant's invention that the (1) electric field intensity along a circumference of the central orbit described by $r = a$ in the $z = 0$ plane is constant, (2) the direction of said electric field faces inwards towards the center and (3) the magnetic field is parallel with the z-axis. Herein, the position of ions constituting the ion beam and the electric and magnetic fields are described utilizing cylindrical coordinates $(r, \phi, z)$. Still further, the intensity and direction of the electric and magnetic fields in the vicinity of the central orbit ($z=o$, $r=a$) and points or positions may be described relative to the central orbit as follows:

$$r = a(1 + \rho) \quad (1)$$

$$z = a \cdot \zeta \quad (2)$$

where $1 > \rho, \zeta$

Rho and zeta therefore represent the deviation from the central orbit as a fraction of the radius $a$.

Taylor expansions enable the determination of the approximate value of certain functions at one point knowning the value of the function of a nearby point and the difference between the points. Hence, the values of the electric and magnetic fields (E and B) near the central orbit at points $r$ and $z$ (for a given $\phi$) found by Taylor expansions are thus:

$$E_r = E_o \cdot (1 + l\rho + \ldots) \quad (7)$$

$$B_z = B_o \cdot (1 + n\rho \rho \ldots) \quad (8)$$

where $l$ and $n$ are the respective first order Taylor expansion coefficients of the equations defining the electric and magnetic fields around the central orbit and $E_o$ and $B_o$ are the values of the electric and magnetic fields at the central orbit.

Conveniently, $l$ can be further expressed as $$l = -(1 + C) \quad (9)$$

where $C$ is the ratio of the radius of curvature of the equipotential line which accords with the central orbit of the ion beam in the central orbit plane (given by $a$) and the radius of curvature of of the equipotential line which passes through the central orbit and the plane included in the z axis (given by Re). Thus, $$C = \frac{a}{Re} \quad (10)$$

Ion orbit equations

By first approximation, differential equations for determining the orbit of the ions in the above superimposed fields are given by $$\frac{d^2\rho}{d\phi^2} = -k_r^2 (\rho - \delta) \quad (3)$$

in the r direction (delta is a dispersion factor described hereafter) and, $$\frac{d^2\zeta}{d\phi^2} = -k_z^2 \cdot \zeta \quad (4)$$

in the z direction.

The coefficients $k_r^2$ and $k_z^2$ are determined according to the properties of the electric and magnetic fields thus, $$k_r^2 = 3 + l - \frac{a}{a_m} \cdot (3 + l - n) + \left(\frac{a}{a_m}\right)^2 \quad (5)$$

and $$k_z^2 = -\frac{a}{a_e} \cdot (1 + l) - \frac{a}{a_m} \cdot n \quad (6)$$

The terms $l$ and $n$ are the first order Taylor expansion coefficients described above. $a_e$ and $a_m$ are the radii of the central ion beam in the electric or magnetic field, respectively.

Now, $\delta$ in equation (3) which is a dispersion factor related to the kinetic energy and mass of the ions is given as follows:

$$\delta = \frac{\gamma + (2 - \frac{a}{a_m}) \cdot \beta}{k_r^2} \quad (11)$$

where $\gamma$ and $\beta$ represent the relation variation rates of the mass and velocity of the ions respectively.

Calculating the central orbits

If we let the mass and velocity of the ions in the central orbit equal $m_o$ and $v_o$, respectively, then the mass $m$ and velocity $v$ of the ions being measured can be expressed as follows:

$$m = m_o (1 + \gamma) \quad (12)$$

$$v = v_o (1 + \beta) \quad (13)$$

Again, if we let the radius of the central orbit of the ions, assuming the electric and magnetic fields to exist independently, equal $a_e$ and $a_m$ respectively, and the electric and magnetic field intensity on the central orbit of the ions equal $E_o$ and $B_o$ respectively, the following relationship is established:

$$\frac{m_o v_o^2}{a_e} = -eE_o \quad (14)$$

$$\frac{m_o v_o}{a_m} = -eB_o \quad (15)$$

Accordingly, when the two fields are superimposed, since the ions traveling along the central orbit satisfy the relationship, viz., $$\frac{m_o v_o^2}{a} = -eE_o - eV_o B_o,$$

the following relationship can be deduced from equations (14) and (15), $$\frac{1}{a} = \frac{1}{a_e} + \frac{1}{a_m} \quad (16)$$

Focusing in the r direction

Regarding the differential equation (3), by resolving under the condition $r^2 > 0$ and that when $\phi = 0$, viz., the initial condition, $$\rho = \rho_1, d\rho/d\phi \approx (1/r) \text{ and } (dr/d\phi) = \alpha r',$$

we obtain $$\rho = \frac{\alpha'_r}{k_r}\sin k_r \phi + (1 - \cos k_r\phi)\,\delta + \rho_1 \cos k_r\phi \qquad (17)$$

In equation (17), the position $\rho_2$ of the ions when $k_r\phi = \pi$ is given as follows, $$\rho_2 = 2\,\delta - \rho_1 \qquad (19)$$

This indicates that the ions are focused at a specific point a $\rho_2$ regardless of the direction of the coefficient $\alpha'r$ when $\phi = \pi/k_r$. As understood from equations (11), (12) and (13), if the mass of all the ions is $m_o$ and their velocity is $v_o$ then $\delta = 0$ and therefore $\rho_2 = -\rho_1$. This means that focusing is effected in exactly the same way as obtaining a real image by means of a convex lens.

On the other hand, since $\gamma$ and $\beta$ in equations (11), (12) and (13) $\neq 0$ in the case of ions having a different mass and velocity, the image in this case is displaced in the amount of 2 $\delta$ which in actual terms of distance is 2a $\delta$. This is referred to as "ion dispersion", a phenomenon which enables the electric and magnetic fields to effect ion separating. The amount of dispersion depends on $\delta$.

Thus, in mass spectrometers, it is desired that separating depends only on the $m/e$ ratio of a group of ions, and dispersion factor $\delta$ is only influenced by $\gamma$ (i.e., the mass relative difference) and not by $\beta$ (the change in velocity). In applicant's spectrometer equation (11) is expressed as $\delta = \gamma/k_r^2$ (i.e., without the $\beta$ term) when $$\frac{a}{a_m} = 2 \qquad (20)$$

Therefore, for a double focusing mass spectrometer utilizing a superimposed field, equation (20) establishes the important relationship for satisfying the required velocity focusing condition. By substitution utilizing equation (20), equation (16) can be rewritten as follows:

$$\frac{a}{a_e} = -1 \qquad (21)$$

From equations (20) and (21) it can be deduced that, since the magnetic field intensity is double that required to bend the ions about a radius a, a counteracting electric field, whose intensity is exactly half that of the magnetic field, is applied so as to bend the ions in the opposite direction. In effect then, the electric field functions so as to cancel out half the magnetic field intensity. As a result, a proper bending radius or radius of curvature a is ensured. Accordingly, the velocity focusing condition can be satisfied simply by field adjustment, regardless of the location of the ion source and image.

Focusing in the z direction

Thus far, I have dealt with focusing in the $r$ direction and velocity focusing. Now I shall deal with focusing in the z direction. The movement of the ions in the z direction is given in equation (4). It will be noted that the dispersion factor $\delta$ appearing in equation (3) is absent in equation (4). This indicates that in the z direction there is no connection between the mass variation rate $\gamma$ and the velocity variation rate $\beta$ of the ions as in the case of the $r$ direction.

By resolving equation (4) under the condition that $k_z^2 > 0$ and that when $\phi = 0$, $\zeta = \zeta_1$, $d\zeta/d\phi \approx (1/r)$ and $(dz/d\phi) = \alpha'_z$ we obtain $$\zeta = \frac{\alpha'_z}{k_z}\sin k_z\phi + \zeta_1 \cos k_z\phi \qquad (18)$$

In equation (18) which resolves equation (4) if $k_z\phi = \pi$, since $\zeta_2 = -\zeta_1$, it follows that a group of ions are focused in the $-a\zeta_1$ position at $$\phi = \frac{\pi}{k_z}$$

and that the dispersion factor will be zero. Since focusing is carried out at $$\phi = \frac{\pi}{k_r}$$

in the $r$ direction and $$\phi = \frac{\pi}{k_z}$$

in the z direction, when $$k_r = k_z \qquad (22)$$

the $r$ direction and z direction focusing positions coincide; in other words, the two dimensional stigmatic focusing condition is satisfied.

From equations (5), (6), (9), (20) and (21) the following values of $k_r^2$ and $k_z^2$ are obtained viz., $$k_r^2 = 2 + C + 2n \qquad (23)$$

and $$k_z^2 = -C - 2n \qquad (24)$$

Accordingly, when $k_r = k_z$, $2 + C + 2n = -C - 2n$, therefore $$C + 2n = -1 \qquad (25)$$

It follows then that when equation (25) satisfies the velocity focusing condition in equations (20) and (21), the condition for satisfying 2-dimensional stigmatic focusing will be a concomitant resultant. (The mechanics for achieving this condition are described hereafter.)

Entering and exiting the superimposed fields in the r direction

Thus far, I have only dealt with the movement of the ions in the superimposed electric and magnetic fields. Now, I propose to deal with the entry of the ions into the superimposed field from free space and the reentry of the ions into free space after passing through said field.

Referring to FIG. 1, I and III indicate the ion pre-entry and post exit free space regions and region II the superimposed field. In other words, the boundary of the superimposed fields is delineated by the $\phi = 0$ plane and the $\Phi = \Phi$ plane. Now, in region I, if the ions follow a path at an angle $\alpha'_r$ with respect to the perpendicular extension of a point located along a line at a distance $l$ ' from the entrance boundry of the superimposed field, the amount of displacement $y_1$ with respect to the central orbit at said entrance boundary can be expressed as follows:

$$y_1 = b' + \alpha'_r \cdot l' \qquad (26)$$

where $b'$ represents the initial displacement of the ions at a distance $l'$ from the entrance boundary. And, since $\rho_1$ in equation (17) is the initial value of $\rho$ in the superimposed field, $y_1$ can be rewritten as follows:

$$y_1 = a \cdot \rho_1 = b' + k'_r \cdot l' \qquad (27)$$

Proceeding to region II, here the orbit of the ions describes an arc as expressed in equation (17). However, since $y_2 = a \rho_2$ at the exit boundary of the superimposed field, equation (17) can be rewritten as follows:

$$\rho_2 = \frac{y_2}{a} = \frac{\alpha_r'}{k_r}\sin k_r\phi + (1 - \cos k_r\phi)\delta + \rho_1 \cos k_r\phi \qquad (28)$$

Moreover, since the orbital tilt angle $\alpha_r''$ at the exit boundary of the superimposed field is expressed as $$\alpha_r'' = [\frac{d\rho}{d\phi}]_{\phi = \Phi} \qquad (29)$$

by substitution utilizing equation (29), equation (17) can be further rewritten as follows:

$$\alpha_r'' = \alpha_r' \cos k_r \Phi = k_r \delta \sin k_r \Phi - \rho_1 k_r \sin k_r \Phi \sin k_r \Phi \qquad (30)$$

Next in region III, the position of the image focusing point $b''$ is expressed as follows:

$$b'' = y_2 + \alpha_r'' l'' \qquad (31)$$

Thus, by substitution utilizing equations (28) and (30), equation (31) in which equation (27) is substituted for $\rho_1$ can be rewritten collectively as follows:

$$b'' = \alpha_r' \left[ \frac{a}{k_r}\sin k_r\phi + l' \cos k_r\phi + l'' (\cos k_r\phi - \frac{l'}{a}k_r \sin k_r\phi) \right] + a \delta (1 - \cos k_r\phi) \qquad (32)$$
$$+ \frac{l''}{a}k_r \sin k_r\phi) + b' (\cos k_r\phi - \frac{l''}{a}k_r \sin k_r\phi)$$

In equation (32), when $\alpha'_r = 0$; i.e., when the ion beam in region I is parallel to the central orbit, if $$\cos k_r\phi - \frac{l''}{a}k_r \sin k_r\phi = 0 \qquad (33)$$

$b''$ becomes unrelated to $b'$. Moreover, $l''$, in this case, accords with the focusing position and is expressed in terms of $g$ as follows:

$$g = \frac{a}{k_r}\cot k_r\phi \qquad (34)$$

Figure 2:
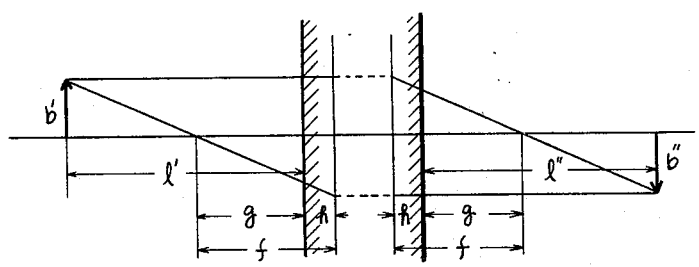
FIG. 2 is a representative drawing of the ion beam optical system shown in FIG. 1 illustrating the focusing process.

Accordingly, the superimposed field can be considered as an exact replica of a thick convex lens and, as such, the optical system shown in FIG. 2 becomes a valid analogy. With regard to FIG. 2, we will first of all ascertain the position of the principal plane of said optical system by calculation. According to definition, the principal plane is located at a distance $l''$ and $l'$ from the field boundary when $b'' = b'$. Accordingly, in equation (32) assuming that $$\cos (k_r\phi) - \frac{l''}{a}k_r \sin (k_r\phi) = 1 \qquad (35)$$

$b''$ becomes equal to $b'$ and unrelated to $b'$ and a $\delta$. It thus follows that, since the distance from the field boundary to the principal plane is equal to $l''$, if $l''$ is expressed in terms of $h$, we have $$h = \frac{a}{k_r} \frac{(\cos k_r\phi - 1)}{\sin k_r\phi} = \frac{a}{k_r}\tan \frac{k_r\phi}{2} \qquad (36)$$

From equations (34) and (36), the focal length of the lens can be expressed as follows:

$$f = g - h = \frac{a}{k_r} \frac{1}{\sin k_r\phi} \qquad (37)$$

Accordingly, by using $f$ and $g$, the relationship between $l'$ and $l''$, based on Newton's formula, is given as follows:

$$(l'-g)(l''-g) = f^2 \qquad (38)$$

From the equation (32), the dispersion D at the image position can be expressed as follows:

$$D = a \delta (1 - \cos k_r\phi + \frac{l''}{a}k_r \sin k_r\phi) \qquad (39)$$

Therefore, by substitution utilizing equations (34), (37) and (38), equation (39) can be rewritten as follows:

$$D = a \cdot \delta \cdot (1 + \frac{f}{l' - g}) \qquad (40)$$

Entering and leaving the superimposed field in the z direction

Thus far, I have dealt with the movement of the ions in the superimposed field and free space traveling along the central orbit plane. Now I propose to discuss the movement of the ions in the z direction in the same way as that for the r direction.

The position of the ions in the z direction is indicated in equation (18). By comparing this equation with equation (17), we find that since, with the exception of the dispersion factor, both equations are virtually the same, the following z direction relationships can be established:

$$z'' = \alpha_z' \left[ \frac{a}{k_z}\sin k_z\phi + l' \cos k_z\phi + l'' (\cos k_z\phi - \frac{l'}{a}k_z \sin k_z\phi) \right] \qquad (41)$$
$$+ z' (\cos k_z\phi - \frac{l''}{a}k_z \sin k_z\phi)$$

$$(l' - g_z)(l'' - g_z) = f_z^2 \tag{42}$$

$$g_z = \frac{a}{k_z} \cot k_z \phi \tag{43}$$

$$f_z = \frac{a}{k_z} \frac{1}{\sin k_z \phi} \tag{44}$$

By comparing equations (34) and (43), and equations (37) and (44) and assuming $k_r = k_z$ as assumed in equation (22), it will be understood that $g = g_z$ and $f = f_z$. It thus follows that the ions traveling through free space then the superimposed field then free space undergo simultaneous focusing in both the $r$ and $z$ directions, that is to say, 2 dimensional stigmatic focusing is effected. It also follows that the 2 dimensional stigmatic focusing condition as expressed in equation (25) is satisfied.

In equation (32):
when $$\frac{a}{k_r} \sin (k_r \phi) + l' \cos k_r \phi + l'' (\cos k_r \phi)$$

$$- \frac{l'}{a} k_r \sin k_r \phi) = 0 \tag{45}$$

directional focusing in the $r$ direction is realized. Further in equation (41)
when $$\frac{a}{k_z} \sin k_z \phi + l' \cos k_z \phi + l'' (\cos k_z \phi)$$

$$- \frac{l'}{a} k_z \sin k_z \phi) = 0 \tag{46}$$

directional focusing in the z direction is realized.

As will be understood by comparing equations (45) and (46), the fact that these equations take the same form as $k_r = k_z$ is another reason for substantiating the ascertation that the 2 dimensional stigmatic focusing condition as expressed in equation (25) is satisfied. Since the velocity focusing condition, as expressed in equations (20) and (21), can be satisfied by simply adjusting the intensity of the electric or magnetic field, regardless of the electric and magnetic field characteristic constants C and $n$, and further, since the 2 dimensional stigmatic focusing condition as expressed in equation (25) can be satisfied simply by setting C and $n$, regardless of the electric or magnetic field intensity, adjustments necessary to satisfy said focusing conditions are easily effected.

Conditions for sweeping the $m/e$ spectrum

If we suppose that the electric field exists independently, the radius of rotation of the ions $a_e$ is expressed as follows:

$$a_e = -\frac{mv^2}{eE} \tag{47}$$

Now, if we let the accelerating voltage equal $Va$, $mv^2 = 2e\ Va$, also if $V_d$ represents the voltage between the electrodes and the gap between said electrodes is $d$, since $E = Vd/d$, equation (47) can be rewritten as follows viz., $$a_e = -\frac{2dVa}{Vd} \tag{48}$$

Accordingly, the radius of rotation of the ions when the electric field exists independently is determined by the accelerating voltage Va, the electric field interelectrodes voltage Vd and the size of the gap $d$; the ion mass $m$ being irrelevant. On the other hand, if we suppose that the magnetic field exists independently, the radius of rotation of the ions $a$ is expressed as follows:

$$a_m = -1/B \sqrt{\frac{2m\ V_a}{e}} \tag{49}$$

As such, it can be deduced that the radius of rotation of the ions varies according to the $m/e$ ratio.

Thus the radius of rotation of the ions traveling along the central orbit in the case of the superimposed field is fixed at a constant value $a$; furthermore, $a_e$ is constant regardless of the ion mass. Therefore, if the magnetic field varies, because $a$ and $a_e$ in equation (16) remain constant, $a_m$ (a fixed quantity) is satisfied with ions of a different mass.

Accordingly, the velocity focusing condition in equations (20) and (21) is satisfied regardless of whether or not said magnetic field varies. In effect, then this means that when the magnetic field intensity is changed, ions having different $m/e$ ratios travel along the central orbit of the superimposed field.

It therefore follows that if the magnetic field portion of the superimposed field is swept, ions having different $m/e$ ratios will satisfy the double focusing condition and therefore, the ions will be intercepted by the collector located at the terminal point of the ion beam optical system. It goes without saying that if the electric field portion of the superimposed field is swept and the magnetic field portion of said superimposed field is kept fixed, the same result, viz., the double focusing condition for ions having different $m/e$ ratios will be satisfied. In this case, however, the ratio of the electric field strength and accelerating voltage must be kept constant.

Apparatus for satisfying the two-dimensional focusing condition

Thus far, we have discussed the general case in which the magnetic field distribution takes the form as shown in equation (8). We now propose to consider the special case in which the magnetic field is uniformly distributed. In this case, since $n = 0$, the 2-dimensional stigmatic focusing condition shown in equation (25) can be rewritten as follows:

$$C = -1 \tag{50}$$

Figure 3:
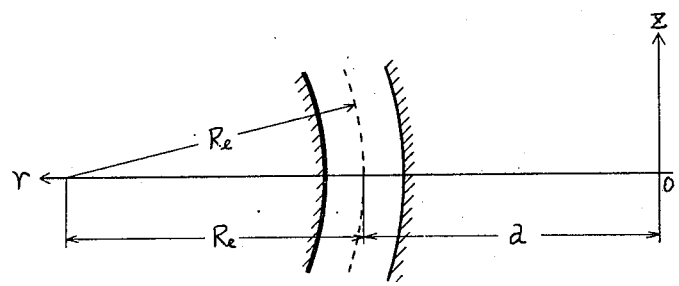
FIG. 3 is an explanatory drawing of one embodiment of this invention.

It follows then that by substituting the above value of C in equation (10), $a = -R_e$. This means, as shown in the embodiment in FIG. 3 that the radius of the central orbit $a$ and the radius of curvature $R_e$ of the equipotential line shown by the broken line which passes through the central orbit on the plane passing through the axis are equal and opposite.

By subtending two saddle-shaped electrodes, this type of electric field becomes a reality and, what is more, the equipotential surface of the electric field also becomes saddle-shaped.

Figure 4:
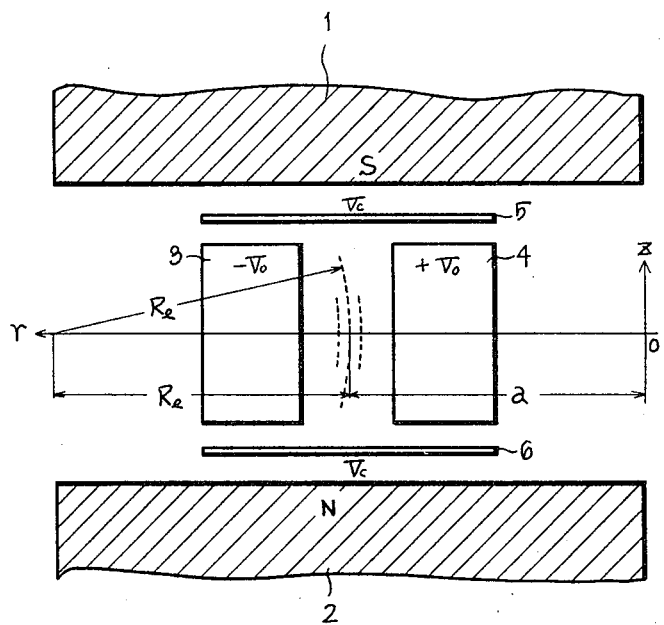
FIG. 4 and FIG. 5 are schematic drawings showing separate embodiments of this invention.

In another embodiment of this invention, the velocity focusing and 2-dimensional stigmatic focusing conditions are satisfied by arranging cylindrical electrodes in a uniform magnetic field. In this embodiment, as in the former, the electric field distribution must satisfy equation (50). FIG. 4 shows the pertinent configuration of this embodiment.

In FIG. 4, are between the clyndrical electrodes 3 and 4 are between magnetic poles 1 and 2 arranged so that the electric field produced by said electrodes 3 and 4 is at right angles to the magnetic field produced by said magnetic poles 1 and 2. Auxiliary electrodes 5 and 6 are arranged symmetrically above and below said cylindrical electrodes 3 and 4. Voltages $-Vo$ and $+Vo$ are applied to electrodes 3 and 4 respectively, and a mutually and equally variable voltage $Vc$ is applied to the two auxiliary electrodes 5 and 6. When $V_c = 0$, the electric field becomes cylindrical and when $V_c \neq 0$, the electric field becomes toroidal.

By setting $Vc$ to an appropriate positive value, an electric field having a saddle-shaped equipotential surface, said surface in turn having a radius of curvature $a$ and $C = -1$, can be obtained as shown by the broken line in FIG. 4. In the case of a superimposed field, however, the electrodes are arranged between the magnetic poles, consideration must be given to their size. Ideally, the ratio of the distance between the electrodes and their height would be 1:2. In this case, if the voltage $Vc$ of the auxiliary electrodes is 0.25 $Vo$, the $C = -1$ condition will be satisfied. The electrodes, by the way, do not necessarily have to be the plate type; strips of metal or lengths of wire would serve the purpose just as well. It goes without saying of course, that the electrodes in the magnetic field must be fabricated of a non-magnetic metal.

Further, as will be appreciated from the equation (25), in the case of a cylindrical electric field, since $R_e = \infty$, even though an $n = -\frac{1}{2}$ nonuniform magnetic field is used, the focusing condition can be satisfied.

Further in an apparatus combining a uniform magnetic field and a $C = -1$ saddle shaped electric field, the value of $k_r$ in the superimposed field is given as follows:

$$k_r = 1 \qquad (51)$$

Single focusing mass spectrometer

In equation (5), if $a = a_m$, the value of $k_r$ when the magnetic field exists independently, is also one. Thus the $r$ direction convergency accords regardless of whether the two fields are used in combination or the magnetic field exists independently. Accordingly, by grounding the electrodes and leaving the other parts as they are, the apparatus can be used as a single focusing mass spectrometer and conversely, by not grounding the electrodes, the apparatus can be used as a double focusing mass spectrometer. Thus, the same apparatus can be used as either a single or double focusing mass spectrometer according to requirements. When used as a double focusing spectrometer, the required magnetic field strength is double that for a single focusing instrument and therefore the mass dispersion as shown in equation (19) is also double.

The advantage of the superimposed fields

Incidentally, when ions accelerated by an accelerating voltage $V_a$ travel through a magnetic field having an intensity B, the radius of orbit of the ions $a_m$ is expressed as follows:

$$a_m = 1/B \sqrt{\frac{2mVa}{e}} \qquad (52)$$

where $m/e$ is the mass-to-charge ratio of the ions.

Now, if it is desired to measure as large an $m/e$ ratio as possible, it is necessary that either $a_m$ or B must be made large or $V_a$ must be made small. However, making $a_m$ or B larger is undersirable. For instance, if $a_m$ is increased, a larger analyzing tube and magnetic field would be required and to increase B would necessitate a larger electromagnet and therefore a larger and bulkier mass spectrometer. Again, decreasing $V_a$ is also undesirable as this adversely affects the sensitivity and resolution of the instrument. In other words, the larger the $V_a$, the better the sensitivity and resolution.

Non-opposing magnetic fields

In the case of an apparatus using a superimposed field, however, assuming that the bending direction of the ions in the electric and magnetic field is the same; i.e., assuming that $a/a_m < 1$, even though $a_m$ is large, since a can be made small, it is possible to detect ions having a large $m/e$ ratio with a weak magnetic field.

Now, if we assume that all the ions emanating from the ion source have the same energy, since from equations (12) and (13), the ion energy U is $$U = \tfrac{1}{2} mv^2 = \tfrac{1}{2} m_o v_0^2 (1 + \gamma + 2\beta) \qquad (53),$$

it can be assumed that $$\gamma + 2\beta = 0 \qquad (54)$$

From this and equation (11)

$$\delta = \frac{1}{k_r^2} \cdot \frac{a}{2a_m} \gamma \qquad (55)$$

If $a/a_m$ is made small, the magnetic field can be weakened without changing the radius of orbit a. However, by so doing, the resolution is adversely affected. Even so, since from equations (5) and (9)

$$k_r^2 = \left(\frac{a}{a_m}\right)^2 = \frac{a}{a_m}(2 - C - n) + (2 - C) \qquad (56),$$

if $a/a_m$ is made less than 1 and the electric field index C and magnetic field constant n are set so that $k_r^2$ becomes small, the mass dispersion $\delta$ in equation (55) can be increased, thereby improving the resolution. Further, when $k_r = 1$, since Barber's law is realized, the setting of the optical system is readily accomplished.

Also, from equations (6) and (9), the expression $$k_z^2 = \frac{a}{a_r} C - \frac{a}{a_m} n \qquad (57)$$

can be obtained. $=-m\ 2-n$

In order to make $a/a_m$ small so as to obtain a large $m/e$ ratio and expand the measuring range of the apparatus, in the case when the position of the ion source and collector are fixed, $k_r$ must also be kept constant. From equation (56), it is shown that if $a/a_m$ is varied, $k_r^2$ will remain constant so long as C and n are varied by the same amount. Again, in order to satisfy the 2 dimensional stigmatic focusing condition, i.e., $k_r^2 = k_z^2$, C and n in equations (43) and (44) must be varied accordingly. In this case though, it is necessary to alter the position of the ion source and collector.

Figure 5:
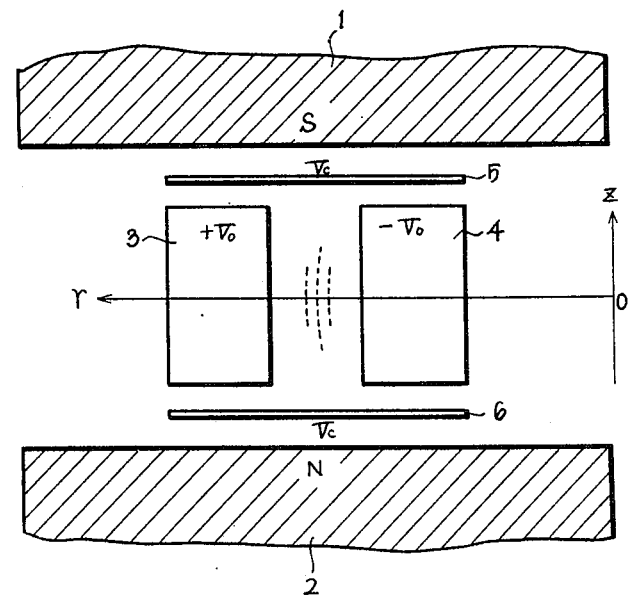

FIG. 5 shows a further embodiment of this invention with nonopposing electric and magnetic fields. In the figure, 1 and 2 are magnetic poles between which cylindrical electrodes 3 and 4 are arranged so that the electric field produced by said electrodes 3 and 4 is at right angles to the magnetic field produced by said magnetic poles 1 and 2. Auxiliary electrodes 5 and 6 are arranged symmetrically above and below said cylindrical electrodes 3 and 4. Voltages $+V_o$ and $-V_o$ are applied to electrodes 3 and 4 respectively and a mutually and equally variable voltage $V_c$ is applied to the two auxiliary electrodes 5 and 6. In this case, the direction of the magnetic field force and the direction of the electric field force must be the same. In this embodiment, since the magnetic field is uniform, $n=0$. Thus, equation (57) can be rewritten as follows:

$$k_r^2 = \left(\frac{a}{a_m}\right)^2 - \frac{a}{a_m}(2-C) + (2-C) \qquad (58)$$

Table 1 below shows the respective values of C and $k_z$ for various values of $a/a_m$ whereby $k_r = 1$, in the case when $n = 0$.

Table 1

| $a/a_m$ | 0.1 | 0.2 | 0.3 | 0.4 | 0.5 | 1 |
|---------|-----|-----|-----|-----|-----|---|
| C       | 0.9 | 0.8 | 0.7 | 0.6 | 0.5 | — |
| $k_z$   | 0.9 | 0.8 | 0.7 | 0.6 | 0.5 | 0 |

However, when $n = 0$ the value of $k_z$ as given in equation (57) becomes, $$k_z^2 = \frac{a}{a_r} \cdot C \qquad (59)$$

Also, Table 2 shows the C values which satisfy the $k_r = k_z$, two dimensional stigmatic focusing condition and the respective $k_r$ and $k_z$ values.

Table 2

| $a/a_m$   | 0.1   | 0.2   | 0.3   | 0.4   | 0.5  |
|-----------|-------|-------|-------|-------|------|
| C         | 1.006 | 1.025 | 1.064 | 1.133 | 1.25 |
| $k_r=k_z$ | 0.951 | 0.906 | 0.863 | 0.825 | 0.791|

From the aforegoing explanation it will be appreciated that even if $a/a_m$ varies, so long as C varies in concert, single focusing and 2 dimensional stigmatic focusing can be attained. However, in order to satisfy the 2 dimensional stigmatic focusing condition, it is necessary to shift the position of the ion source or collector, because the values of $k_r$ and $k_z$ change. C can be adjusted by varying the voltage applied to the auxiliary electrodes 5 and 6 in FIG. 3, that is to say, by varying $V_c$. When $V_c = 0$, the electric field becomes cylindrical; however, by making $V_c > 0$, a toroidal electric field in which $C > 0$ can be obtained. Accordingly, when $a/a_m$ is varied, C can be determined by setting the voltage applied to the auxiliary electrodes positively and appropriately; i.e., so as to obtain the required value of $k_r$. As for the type of the auxiliary electrodes suitable for use, strips of metal or lengths of wire would do quite well in lieu of plate type electrodes. It goes without saying of course, that the electrodes in the magnetic field must be fabricated of a non-magnetic metal.

As one example, let us consider an apparatus having an orbit radius of 10cm. In this case, $a/a_m$ is shown in Table 3 against values of C with respect to magnetic field intensity B and resolution R. The values of the magnetic field intensity B as listed in Table 3 correspond to an accelerating voltage of 1,000 V and a monovalent ion mass number of 100. In this case, if $k_r = 1$; i.e., if Barber's law is brought into effect, the relation between the position of the ion source and collector remains the same, $l' = l'' = 10$cm when the vertical angle $\Phi$ of the superimposed field is 90° and $l' = l'' = 17.3$ cm when $\Phi$ is 60°.

Table 3

| $a/a_m$ | C   | $k_z$ | B(gauss) | R    |
|---------|-----|-------|----------|------|
| 0.5     | 0.5 | 0.5   | 2250     | 500  |
| 0.2     | 0.8 | 0.8   | 900      | 200  |
| 0.1     | 0.9 | 0.9   | 450      | 100  |
| 1       | —   | 0     | 4500     | 1000 |

The results shown in the bottom column in Table 3 are those calculated under the same condition as a single focusing mass spectrometer with only a magnetic field. It will thus be readily appreciated from these results that the magnetic field intensity B in the single magnetic field case is much higher than B in the case of a superimposed field. For example, using a superimposed field, when $a/a_m = 0.1$, a magnetic field intensity of only 450 gauss (1/10th of that required for an apparatus with only a magnetic field) is sufficient. Moreover, this can be attained with aircore coils, thereby eliminating the use of iron. Another advantage of aircore coils is that since the inductance is large, high speed scanning is facilitated. Column R (Table 3) shows the resolution when the sum of the main slit $S_o$ and the collector $S_c$ are 0.1 mm. In view of the fact that weakening the magnetic field decreases the resolution, this invention is unsuitable for adaption to a mass spectrometer intended for use as a high resolution instrument. The resolution R is given as follows:

$$R = \frac{m}{\Delta m} = \frac{1}{\gamma} = \frac{1}{k_r^2} \cdot \frac{a}{2a_m} \cdot \frac{a(1+X)}{(XS_o+S_c)} \qquad (60)$$

However, the image magnification is expressed by $$X = \frac{b'}{b''}.$$

Furthermore, in the invention as heretofore described utilizing a superimposed electric and magnetic field, it is possible to design an apparatus which is surprisingly compact. Also, directional focusing control is not difficult to carry out. This is especially true in the case of the embodiments of this invention incorporating auxiliary electrodes. In this case, directional focusing can be controlled simply by varying the voltage applied to the auxiliary electrodes, thus obviating the need for a mechanical adjusting means, thereby making adjustment extremely easy.

Having thus described my invention with detail and particularity as required by the Patent Laws, what is desired protected by Letters Patent is set forth in the following claims.

I claim:

1. In a mass spectrometer, the improvement comprising means for creating superimposed electric and magnetic fields substantially at right angles through which are ion beam is passed prior to detection, and means for adjusting the strength of the electric and magnetic fields to cooperate in turning the ion beam such that the radius of the central ion orbit a and the radius $a_m$ of the beam in an independently existing magnetic field assumed to have the same intensity as said field satisfy the relationship $a/a_m < 1$ whereby ions having a large $m/e$ ratio may be detected with a weak magnetic field and wherein the means for adjusting the strength of the electric field comprises two condenser electrodes spaced on opposite sides of the central ion orbit for being oppositely charged and two auxiliary electrodes spaced in the electric field on opposite sides of the central ion orbit at right angles to the condenser electrodes for being like charged.

2. The improvement in the mass spectrometer according to claim 1 wherein the means for adjusting the electric and magnetic fields are swept to vary the value of $a/a_m$ to measure an ion spectrum such that the values of C and n are adjusted to maintain $k_r^2$ constant where $$k_r^2 = (a/a_m)^2 - a/a_m(2 - C - n) + (2 - C)$$

and the value of the electric field index C is the ratio of the radius of the central orbit of the ion beam on a plane located at right angles to the dirction of travel of said beam, n being a coefficient in the expansion defining the magnetic field thus $$B_z = B_o (1 + n\rho + \ldots).$$

3. In a mass spectrometer, the improvement comprising means for creating superimposed electric and magnetic fields substantially at right angles through which an ion beam to be analyzed is passed prior to detection, said electric field arranged such that the central ion orbit coincides with an equipotential surface of the electric field, said electric and magnetic fields arranged such that the electric field opposes the turning of the ion beam through its orbit by the magnetic field and the central ion beam orbit has a radius a determined by the equation:

$$\frac{1}{a} = \frac{1}{a_e} + \frac{1}{a_m}$$

where $a_e$ is the radius of the ion orbit traveling along an equipotential plane on an independently existing electric field assumed to have the same intensity as the said electric field, and where $a_m$ is the radius of the central orbit of said ion beam traveling an independently existing magnetic field assumed to have the same intensity as the said magnetic field and means for adjusting the strength of the electric and magnetic fields to satisfy the relationships $$a/a_e = -1 \text{ and } a/a_m = 2$$

whereby the double focusing condition in the radial direction is satisfied.

4. The improvement in the mass spectrometer of claim 3 further comprising means for adjusting the strength and configuration of the electric and magnetic fields such that the electric field index C and the characteristic constant n of the magnetic field satisfy the relationship $$C + 2_n = -1$$

where C is the ratio of $a/R_e$ and where $a$ is the radius of the central ion orbit and $R_e$ is the radius of curvature of the equipotential line passing through the central ion orbit in a plane including the orbital axis, and the characteristic constant n is the first order expansion coefficient in the expansion $B_z = B_o (1 + n\rho + \ldots)$ defining the magnetic field near the central orbit, whereby the double focusing condition is satisfied in both the radial and the axial directions.

5. The improvement in the mass spectrometer according to claim 4, wherein the magnetic field is substantially uniform and perpendicular to the plane of the central orbit, that is, $n = 0$, and the electric field has a saddle shaped equipotential surface passing through the central orbit for which $a/R_e$ or C equals $-1$.

6. The improvement in the mass spectrometer according to claim 4 wherein the means for adjusting the strength and configuration of the electric field comprises two condenser electrodes spaced on opposite sides of the central ion orbit for being oppositely charged to form the electric field and two auxiliary electrodes spaced in the electric field on opposite sides of the central ion orbit at right angles to the condenser electrodes for being like charged to shape the electric field.

7. The improvement according to claim 6 wherein the condenser electrodes are cylindrical.

* * * * *

UNITED STATES PATENT OFFICE
CERTIFICATE OF CORRECTION

PATENT NO. : 3,984,682
DATED : October 5, 1976
INVENTOR(S) : Hisashi Matsuda

It is certified that error appears in the above-identified patent and that said Letters Patent are hereby corrected as shown below:

Equation 8
Column 3 Line 29 "$\phi$" (second occurrence) should be deleted.

Column 4 Line 23 "relation" should read --relative--.

Equation 30
Column 7 Line 33  The equal sign "=" (second occurrence) should read a plus sign --+--.

Equation 30
Column 7 Line 34 " sin $k_r \phi$" should be deleted.

Column 12 Line 63 "= - m 2-n" should be deleted.

Claim 1 - Column 15 Line 7 "are" should read --an--.

Claim 3 - Column 15 Last line - the Equation

The minus sign "-" should read an equal sign "=".

Signed and Sealed this

Fourteenth Day of December 1976

[SEAL]

Attest:

RUTH C. MASON
*Attesting Officer*

C. MARSHALL DANN
*Commissioner of Patents and Trademarks*